(12) United States Patent
Takase et al.

(10) Patent No.: US 7,226,571 B2
(45) Date of Patent: Jun. 5, 2007

(54) HIGH RESISTIVITY SILICON WAFER AND METHOD FOR FABRICATING THE SAME

(75) Inventors: Nobumitsu Takase, Tokyo (JP); Shinsuke Sadamitsu, Tokyo (JP); Takayuki Kihara, Tokyo (JP); Masataka Hourai, Tokyo (JP)

(73) Assignee: Sumitomo Mitsubishi Silicon Corporation, Tokyo (JP)

( * ) Notice: Subject to any disclaimer, the term of this patent is extended or adjusted under 35 U.S.C. 154(b) by 246 days.

(21) Appl. No.: 10/964,728

(22) Filed: Oct. 15, 2004

(65) Prior Publication Data

US 2005/0127477 A1  Jun. 16, 2005

(30) Foreign Application Priority Data

Oct. 16, 2003  (JP) .............................. 2003-355780

(51) Int. Cl.
*C30B 15/20* (2006.01)
(52) U.S. Cl. ....................... 423/328.2; 117/19; 117/20; 117/49
(58) Field of Classification Search .................. 117/13, 117/19, 20, 49; 423/328.2
See application file for complete search history.

(56) References Cited

FOREIGN PATENT DOCUMENTS

| JP | 2000-100631 | 4/2000 |
|---|---|---|
| WO | WO00/55397 | 9/2000 |

*Primary Examiner*—Felisa Hiteshew
(74) *Attorney, Agent, or Firm*—Clark & Brody

(57) ABSTRACT

A high resistivity p type silicon wafer with a resistivity of 100 Ωcm or more, in the vicinity of the surface being formed denuded zone, wherein when a heat treatment in the device fabrication process is performed, a p/n type conversion layer due to thermal donor generation is located at a depth to be brought into contact with neither any device active region nor depletion layer region formed in contact therewith or at a depth more than 8 μm from the surface, and a method for fabricating the same. The high resistivity silicon wafer can cause the influence of thermal donors to disappear without reducing the soluble oxygen concentration in the wafer, whereby even if various heat treatments are performed in the device fabrication process, devices such as CMOS that offer superior characteristics can be fabricated. The wafer has wide application as a substrate for a high-frequency integrated circuit device.

18 Claims, 5 Drawing Sheets

HIGH RESISTIVITY SILICON WAFER AND METHOD FOR FABRICATING THE SAME

BACKGROUND OF THE INVENTION

1. Field of the Invention

The present invention relates to a high resistivity silicon wafer used as a substrate for a high-frequency integrated circuit device etc., and a method for fabricating the same.

2. Description of the Related Art

With the widespread use or micronization of high-frequency devices and/or the increase in the amount of signal for mobile communication, near-field wireless LAN etc., there has been increasing demand for high-frequency circuits. High resistance is required for high-frequency circuit substrates, for which compound semiconductors such as GaAs have conventionally been adopted frequently. However, compound semiconductor substrates are very expensive.

For such application, CMOS (Complementary Metal Oxide Semiconductor) devices using substrates made of single crystals of silicon obtained by the normal Czochralski method (CZ method) have been considered inappropriate due to large power consumption and high possibility of substrate noise generation. However, as the improvement of micronization technique, designing etc. has been promoted, the use of silicon wafers with high resistivity has been allowing the problems above to be overcome.

The resistivity of high-purity silicon is found to be $2.3 \times 10^5$ $\Omega$cm, which results in too high electrical resistance to be used as a substrate material. Hence, a slight amount of dopant such as boron (B: p type) or phosphorus (P: n type) is added to adjust the resistivity as desired.

Meanwhile, since the increase in the amount of impurities in a semiconductor is likely to reduce the electrical resistance thereof, high resistivity silicon wafers, if necessary, have conventionally been made of single crystals obtained by the Floating Zone method (FZ method) that makes it easy to achieve higher purity. However, the FZ method has difficulties in fabricating large-diameter single crystals and has problems relating to stability of quality and cost, resulting in drawbacks of not allowing an enough response to demand.

In accordance with the CZ method, a single crystal of silicon is fabricated by melting raw material using a quartz crucible and pulling directly from the melt, and thereby contains usually about 20 ppma ($16 \times 10^{18}$ atoms/cm$^3$ [ASTM F121-1979]) of oxygen eluted from the quartz crucible.

Oxygen contained in such a relatively high concentration as above causes defects in wafer resulting in a faulty characteristic of devices, while in the device fabrication process performs complex functions such as increasing wafer strength to prevent deformation and forming minute defects, in wafer, having gettering effect for trapping mixed heavy metal ions that cause a faulty operation of devices.

As is well known, the resistivity of silicon wafers can be increased by reducing the amount of dopant. However, in the use of single crystals of silicon obtained by the CZ method, inevitably mixed oxygen can change the resistivity significantly. Oxygen atoms are usually electrically neutral in silicon and thereby have no impact on the electrical resistance thereof directly.

However, a long-time heat treatment at a lower temperature range of 300 to 500 degrees C. forms compounds that have failed to be transformed into stable SiO$_2$ precipitates, which emit electrons to show the behavior of donors' nature, being called oxygen donors or thermal donors.

FIG. 1 is a view typically showing the relationship between the generation number of thermal donors and the resistivity of wafers. In the case of low resistivity wafers with a normal resistivity of about 10 $\Omega$cm, the amount of dopant is large enough in comparison with the generation number of thermal donors, whereby thermal donors, even if generated, have a minor impact on the resistivity. However, in the case of high resistivity wafers, the amount of dopant is small, whereby the resistivity can be affected significantly by thermal donors.

Particularly in the case of p types, the conductivity caused by positive holes as acceptor holes disappears due to electron supply from donors resulting in a significant increase in resistivity, and a further increase in the number of donors causes conversion to n type semiconductors, resulting in a reduction in resistivity. Heating process in the temperature range where thermal donors can easily be generated is to be performed necessarily as a heat treatment in the final stage of the device fabrication process.

The generation amount of thermal donors decreases in silicon wafers with low oxygen concentration. Hence, there are proposed methods for fabricating single crystals with low oxygen concentration to reduce oxygen content, such as applying the Magnetic field applied Czochralski method (MCZ method) wherein a single crystal is pulled from molten silicon liquid in a quartz crucible while applying a magnetic field thereto to control the flow, and using a quartz crucible on the inner surface of which is coated SiC.

These methods for oxygen reduction, however, have technical limitations in oxygen reduction, causing also an increase in cost, and further suffer from a problem in that the oxygen reduction causes a reduction in wafer strength, whereby defective products due to deformation can be easily generated in the device fabrication process.

An invention relating to a high resistivity wafer using a single crystal of silicon obtained by the CZ method and eliminating the influence of thermal donors and a method for fabricating the same is disclosed in the brochure of International Patent Publication No. WO 00/55397 (hereinafter referred to as "document 1"). This invention is characterized in that a single crystal with a resistivity of 100 $\Omega$cm or more and an initial interstitial oxygen (soluble oxygen) concentration of 10 to 25 ppma ($7.9 \times 10^{17}$ to $19.8 \times 10^{17}$ atoms/cm$^3$ [ASTM F121-1979]) and with normal oxygen content obtained by the CZ method is processed into a wafer, and then an oxygen precipitate treatment is applied to the wafer to reduce the residual interstitial oxygen concentration to 8 ppma or less ($6.4 \times 10^{17}$ atoms/cm$^3$ [ASTM F121-1979]). The wafer thus obtained is regarded as to have no reduction in resistivity, due to the prevention of oxygen donor generation by a heat treatment subjected in the device fabrication process.

In the invention above, the heat treatment method for reducing the residual interstitial oxygen concentration down to 8 ppma is considered a fundamental basis of the technology. However, in the document 1 above is described that since oxygen precipitates have only to be formed as a result to reduce the residual interstitial oxygen concentration 8 ppma or less, the heat treatment condition range etc. should not be restricted particularly, having no clear definition.

In an embodiment of the invention are barely shown a two-step heat treatment including a 4-hour heating at 800 degrees C. in oxygen or nitrogen atmosphere and a 16-hour heating at 1000 degrees C. in oxygen atmosphere, and a three-step heat treatment including a 2-hour heating at 650 degrees C. in oxygen atmosphere, a 4-hour heating at 800 degrees C. in the same atmosphere and a 16-hour heating at 1000 degrees C. in oxygen atmosphere.

The DZ-IG (Denuded Zone—Intrinsic Gettering) treatment is generally employed as a method for controlling the presence of oxygen in the wafer thickness direction on which devices are to be formed. This is a heat treatment adapted to prepare the region in the vicinity of the wafer surface in which devices are to be formed, that is, active region as denuded zone (DZ), and to form defects due to oxygen precipitates having a function of trapping heavy metal ions etc. being mixed in the wafer.

Generally, a three-step heat treatment is to be performed, including (1) an oxygen outward diffusion heat treatment at high temperature for forming DZ in the surface region, (2) a low-temperature heat treatment for forming precipitate nuclei (heat treatment for forming oxygen precipitate nuclei) and (3) a middle or high-temperature heat treatment for forming defects due to oxygen precipitates to be operated internally as gettering sites (heat treatment for growing oxygen precipitates).

In Japanese Patent Laid-Open Publication No. 2000-100631 (hereinafter referred to as "document 2") is disclosed an invention relating to a high resistivity wafer with a resistivity of 100 Ωcm or more to which the DZ-IG treatment is applied, and relating to a condition thereof. This invention is characterized, as is the case with the invention described in the document 1, in that the interstitial oxygen concentration at any portion of the wafer is 8 ppma or less, having DZ in the vicinity of the surface and an oxygen precipitate layer in the bulk portion, and on that basis the width of the transition region between the DZ and the oxygen precipitate layer is 5 µm or less.

In a method for fabricating a wafer according to the invention described in the document 2 above is used a wafer processed from a single crystal with an initial interstitial oxygen concentration of 10 to 25 ppma obtained by the CZ method, and is performed a four-step heat treatment comprising (a) first heat treatment at 950 to 1050 degrees C. for 2 to 5 hours, (b) second heat treatment at 450 to 550 degrees C. for 4 to 5 hours, (c) third heat treatment at 750 to 850 degrees C. for 2 to 8 hours and (d) fourth heat treatment at 950 to 1100 degrees C., to reduce the interstitial oxygen concentration to 8 ppma or less as described above.

In the case above, it would appear that the first heat treatment indicated by (a) is an oxygen outward diffusion heat treatment for forming DZ in the surface region and that the fourth heat treatment indicated by (d) is an oxygen precipitate treatment for forming gettering sites, while (b) and (c) are for performing treatments for forming precipitate nuclei sufficiently to reduce the interstitial oxygen concentration 8 ppma or less assuredly.

However, it is not necessarily easy to reduce the soluble oxygen concentration to 8 ppma or less across the wafer thickness direction by the heat treatments, requiring a lot of man-hours for the heat treatments and resulting in an increase in fabrication cost. In addition, reducing the soluble oxygen concentration results in a great reduction in wafer strength, whereby wafer deformation and/or slip dislocation can easily be generated in a high-temperature heat treatment performed in the device fabrication process even if the number of oxygen donors may be reduced.

SUMMARY OF THE INVENTION

The present invention is characterized by providing a high resistivity p type wafer using a single crystal obtained by the CZ method with superior characteristics, wherein CMOS formed in active regions in the surface region may infrequently suffer from a faulty operation, insufficient n-well separation, etc., and a method for fabricating the same.

When examining the characteristics of CMOS formed by a device manufacturer on high resistivity wafers that are made of p type single crystals obtained by the CZ method, the present inventors have encountered a problem in that there are some wafers that have desired characteristics insufficiently or in which adjacent n-wells cannot be separated sufficiently.

As a result of various examinations, in order to deal with the situation above, for the high resistivity wafers suffering from the problem, the followings have been revealed. First, in the wafers before devices being formed thereon, DZ in the surface layer or internal oxygen precipitates referred to also as BMD (Bulk Micro Defects), are distributed normally without any problem.

However, when examining the wafers after CMOS devices being formed thereon, there are some ones with p type semiconductors near the surface while inner portion being converted to n type semiconductors. Particularly in the case the p/n type conversion layer exists in the vicinity of the surface, there are some wafers that have CMOS characteristics not reaching desired values or suffer from an insufficient n-well separation.

A further examination showed that internal conversion of the conduction type from p type to n type, as is often the case with wafers with higher resistivity, even if caused, has little impact on CMOS characteristics and/or n-well separation as long as the p/n type conversion layer is located at a sufficient depth.

It is presumed that such internal conversion from p type to n type in wafers is caused by thermal donors generated by a heat treatment in the fabrication process for forming devices as described in FIG. 1 above. However, the reduction of soluble oxygen concentration across all portions of the wafers to prevent thermal donor generation suffers from problems in that the heat treatment should be performed sufficiently and further that the wafer strength would be reduced.

Hence, a still further examination was made based on the consideration that even if there occurs an internal conversion of the conduction type from p type to n type due to thermal donor generation, the p/n type conversion layer has only to not impact on the operation of CMOS formed in the surface region. It has been consequently found that the p/n type conversion layer has only to be separated sufficiently from a depletion layer, which is generated between wells and the wafer substrate, when a n-well is formed on a p type wafer substrate. In the case of wafers with higher resistivity, since depletion layer region becomes larger than in the case with lower resistivity, it is necessary to increase the depth of generated p/n type conversion layer from the surface sufficiently.

FIGS. 2A and 2B are views illustrating the constitution of CMOS formed on such a p type wafer as above and the relationship with a p/n type conversion layer. The CMOS shown in the figures has a twin-well structure adapted in such a manner that p-wells and n-wells complement each other. The p-wells as well as n-wells and depletion layers 1 are formed in the substrate thickness direction from the surface of the p type wafer 3, which is converted to a n type wafer 4 internally due to the generation of the p/n type conversion layer 2.

In FIG. 2A, the p/n type conversion layer 2 is brought into contact with depletion layer region, whereby the n-wells are not separated sufficiently and predetermined characteristics cannot be realized. Meanwhile, it is found that little impact is to be found on the CMOS characteristics and/or n-well separation by generating the p/n type conversion layer 2 at a sufficient depth as shown in FIG. 2B.

The possibility of whether or not a conversion of the conduction type from p type to n type occurs is greatly affected by the amount of generated thermal donors and the amount of dopant into wafer as guessed from FIG. 1 above. The amount of generated thermal donors can be estimated by the amount of oxygen, the heat treatment condition for wafers, and the thermal history when forming devices, while the amount of dopant is almost determined by the wafer resistivity, where a higher resistivity means a smaller amount of dopant.

Accordingly, the possibility of whether or not a conversion of the conduction type from p type to n type occurs can be predicted when the conditions above are obtained. It seems thus possible to prevent causing a conversion of the conduction type from p type to n type by selecting the heat treatment condition for wafers if the thermal history when forming devices can be obtained.

However, even if a conversion of the conduction type from p type to n type may occur, the conversion has no impact on the device performance as long as regions in which devices are to be formed remaining to be p types and the layers converted to n type are located at a sufficient depth, and therefore it is only required that the generation position (i.e. the depth from the surface) of p/n type conversion layer rather than the occurrence of conversion of the conduction type from p type to n type can be controlled.

For the purpose, for example, of reducing defects in active region in the vicinity of the surface, a high-temperature heat treatment is applied to wafers. When wafers are heated at high temperature, an outward diffusion of oxygen often occurs resulting in a reduction in oxygen concentration in the surface layer. Therefore, in the case of a treatment in the device fabrication process under a condition where thermal donors are to be generated, even if inner portion of wafers is converted to n type, the region in the vicinity of the surface has low oxygen concentration and thereby small number of thermal donors, which makes it possible to remain to be p type.

Thus, based on presumption that the reduction in oxygen concentration in the vicinity of the wafer surface determines the position of p/n type conversion layer, it was considered that even if a conversion of the conduction type from p type to n type may occur in the wafer, the conversion layer can be moved to a position where the operation of devices in the surface region is not affected by controlling outward diffusion of oxygen due to the high-temperature heat treatment.

Hence, on the basis that after applying a 1 hour heat treatment at 450 degrees C. to a high resistivity wafer under a condition of the sintering process etc. when fabricating devices where thermal donors are most likely to be generated, the resistivity distribution in the thickness direction is examined by the measuring method for spreading resistance to obtain the position of p/n type conversion layer, various heat treatments such as oxygen outward diffusion heat treatment are applied to the wafer to examine the impacts of the condition.

P/n type conversion layer has only to be located at a depth to be brought into contact with neither any surface region in which devices are to be formed as described above, nor any depletion layer formed in contact with n-wells. Since an examination about this positioning showed that there seems little impact as long as the depth is 8 μm or more from the surface, the heat treatment condition has been examined based on a criterion that p/n type conversion layer should be located at a depth of 8 μm or more from the surface.

It was consequently found that an oxygen outward diffusion heat treatment at high temperature for 1 hour or more in a controlled atmosphere using argon, hydrogen, a mixed gas thereof, or another mixed gas of nitrogen with a small amount of oxygen can increase the depth of p/n type conversion layer in a limited time period. Although high-temperature heating can realize an outward diffusion of oxygen even in an oxygen atmosphere or an atmosphere containing oxygen, it seems that the partial pressure of oxygen in the vicinity of the surface can be further reduced in a non-oxidizing or weak oxidizing atmosphere, resulting in an increase in release rate of oxygen. High-temperature heat treatment in a non-oxidizing atmosphere has also an effect of causing defects in the vicinity of the surface such as COP (Crystal Originated Particle) defects to disappear, as is the case with the so-called DZ treatment.

Also, the region used for forming devices thereon is restricted to a small range of depth from the wafer surface region. For this reason, it is recently often the case that other lower region of wafers that is not used for forming devices thereon is eliminated by polishing etc. and is not to be used. In view of the situation above, it is not necessary to reduce the oxygen concentration across all portions of wafer, and an oxygen outward diffusion heat treatment allows the amount of oxygen in the wafer surface region to be used for forming devices thereon to be reduced sufficiently and p type regions with high resistivity for forming devices thereon to be ensured.

It is preferable, after reducing the amount of oxygen in the surface region above by an outward diffusion, to perform a heat treatment including a low-temperature heating and further a high-temperature heating, that is, an oxygen precipitate heat treatment. The oxygen precipitate heat treatment promotes oxygen precipitation, whereby the amount of residual oxygen in the wafer decreases, resulting in an increase in resistivity. Further, it is possible to generate a p/n type conversion layer at a deeper position.

The oxygen precipitate heat treatment includes a heat treatment for forming oxygen precipitate nuclei by low-temperature heating to re-form or grow nuclei for oxygen precipitation that have disappeared or shrunk due to high-temperature heating for outward diffusion of oxygen, and a heat treatment for growing oxygen precipitates by high-temperature heating to further grow the nuclei to be oxygen precipitates.

Depending on the type of devices, with too low resistivity in wafer, the amount of current that flows through a region located deeper than those used for devices increases, which causes energy loss and/or current noise, resulting in a significant deterioration of device characteristics. For this reason, increase in resistivity in region located deeper than those used for devices may be required.

In the case above, with just applying oxygen outward diffusion heat treatment to wafers, it is difficult to reduce the amount of oxygen in the wafers, that is, across all portions of the wafers, resulting inevitably in an increase in residual oxygen concentration in the wafers. To deal with this, it is preferable to perform oxygen precipitate heat treatment after diffusing oxygen in the wafer surface region outward.

That is, in regard to problems such as energy loss and current noise generation due to low resistivity in wafer, since it is only required that increase in resistivity in the region located deeper than those used for devices is achieved, and there seems no problem even if the conduction type is n type, it is effective to perform an oxygen precipitate heat treatment to increase resistivity in wafer converted to n type.

The present invention has been achieved on the basis of the foregoing examination results and the knowledge obtained therefrom, and further by clarifying marginal conditions for acquiring more desired conditions concerning DZ in the surface region, the generation position of p/n type conversion layer and the internal formation of BMD. Therefore, the present invention is summarized as the following high resistivity silicon wafers (1) to (3) and methods for fabricating a high resistivity silicon wafer (4) to (6).

(1) A high resistivity p type silicon wafer with a resistivity of 100 Ωm or more, in the vicinity of the surface being formed denuded zones, wherein when a heat treatment in the device fabrication process is performed, a p/n type conversion layer due to thermal donor generation is located at a depth to be brought into contact with neither any device active region nor depletion layer region formed in contact therewith.

(2) A high resistivity p type silicon wafer with a resistivity of 100 Ωcm or more, in the vicinity of the surface being formed denuded zones, wherein when a heat treatment in the device fabrication process is performed, a p/n type conversion layer due to thermal donor generation is located at a depth more than 8 μm from the surface.

(3) It is preferable that the high resistivity silicon wafers according respectively to (1) and (2) above are internally composed of layers containing oxygen precipitates and contain $0.5 \times 10^{16}$ to $32 \times 10^{16}$ atoms/cm$^3$ (ASTM F123-1981) of carbon.

(4) A method for fabricating a high resistivity silicon wafer, characterized in that a wafer with a resistivity of 100 Ωm or more made of a p type single crystal obtained by the Czochralski method is used and an oxygen outward diffusion heat treatment is applied thereto, whereby when a heat treatment in the device fabrication process is performed, a p/n type conversion layer due to thermal donor generation is generated at a depth to be brought into contact with neither any device active region nor depletion layer region formed in contact therewith.

(5) A method for fabricating a high resistivity silicon wafer, characterized in that a wafer with a resistivity of 100 Ωcm or more made of a p type single crystal obtained by the Czochralski -method is used and an oxygen outward diffusion heat treatment is applied thereto, whereby when a heat treatment in the device fabrication process is performed, a p/n type conversion layer due to thermal donor generation is generated at a depth more than 8 μm from the surface.

(6) In the methods for fabricating a high resistivity silicon wafer according respectively to (5) and (6), it is preferable to additionally perform a heat treatment for forming oxygen precipitate nuclei and a heat treatment for growing oxygen precipitates after the oxygen outward diffusion heat treatment, and it is possible to perform the oxygen outward diffusion heat treatment at 1100 to 1250 degrees C. for 1 to 5 hours in a controlled atmosphere, the heat treatment for forming oxygen precipitate nuclei at 600 to 800 degrees C. for 1 to 20 hours, and the heat treatment for growing oxygen precipitates at 1000 to 1100 degrees C. for 1 to 20 hours.

As described above, in accordance with a high resistivity silicon wafer of the present invention, there occur many problems such as faulty characteristics and n-well separation failure when devices such as CMOS is formed in the surface region. One reason for the frequent occurrence of such problems in high resistivity silicon wafers is that the wafers come under the strong influence of thermal donors easily.

Although there is a method for keeping the soluble oxygen concentration in wafer as low as possible to prevent the generation of thermal donors, the reduction of soluble oxygen concentration causes a reduction in wafer strength and thereby troubles due to deformation in the device fabrication process. Also, it will take a lot of man-hours to keep the soluble oxygen concentration in wafer to low by heat treatment.

Accordingly, the high resistivity silicon wafer of the present invention, in which the soluble oxygen concentration is not reduced, suffers from no such problems and becomes unaffected by thermal donors through efficient treatments even if various heat treatments are performed in the device fabrication process, whereby devices such as CMOS that offers superior characteristics can be fabricated.

DETAILED DESCRIPTION OF THE PREFERRED EMBODIMENTS

Figure 1:
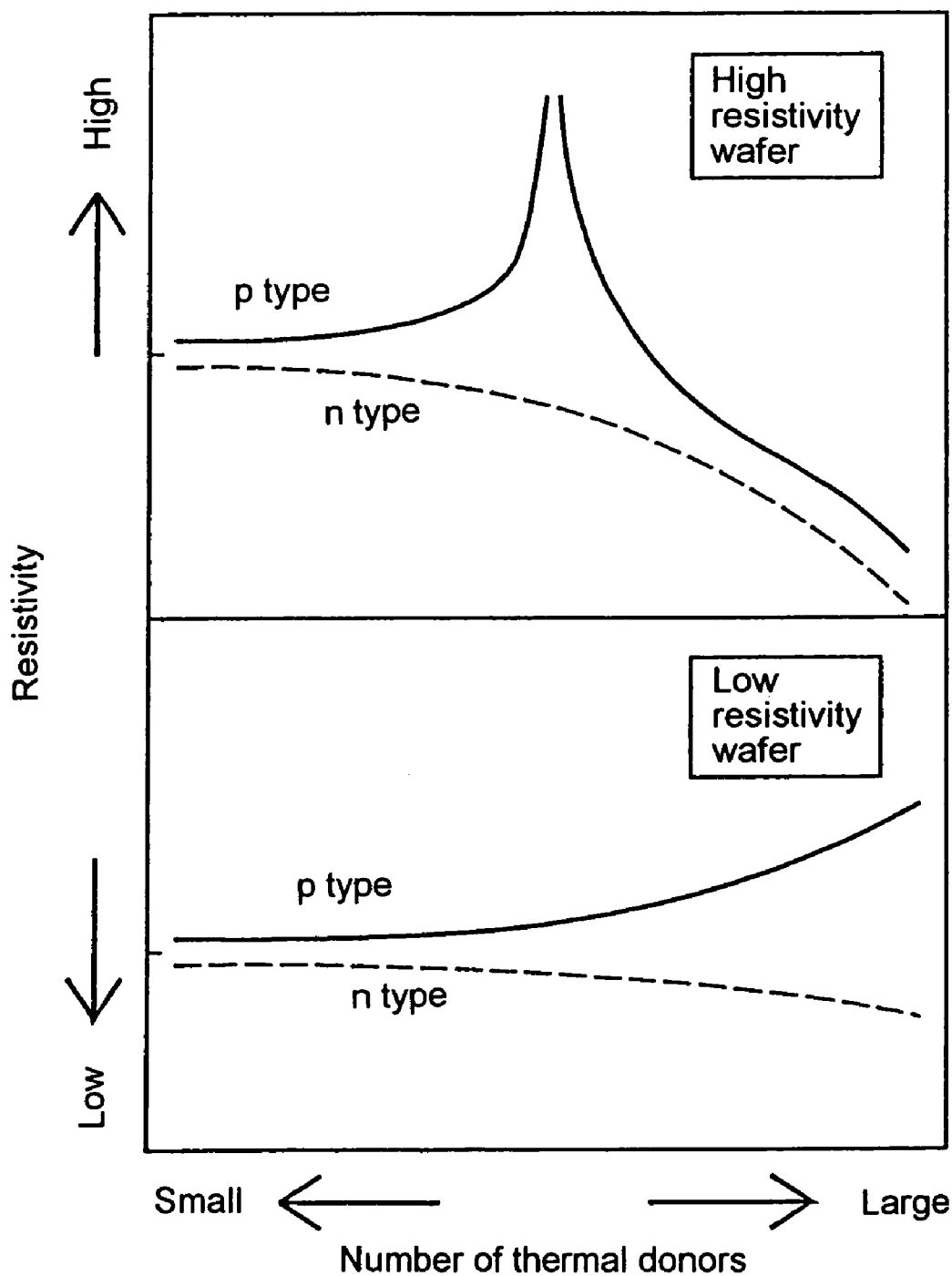
FIG. 1 is a view illustrating that high resistivity silicon wafers come under the strong influence of thermal donors, and particularly in the case of p types, the resistivity changes significantly.
Figure 2A:
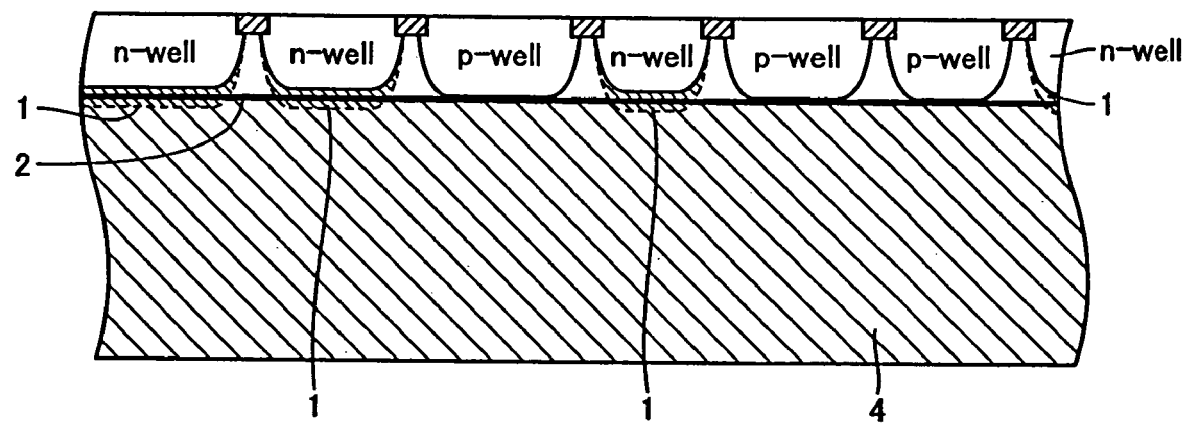
FIG. 2 is a view illustrating the relationship between the construction of CMOSs formed on a p type wafer and a pin type conversion layer.
Figure 2B:
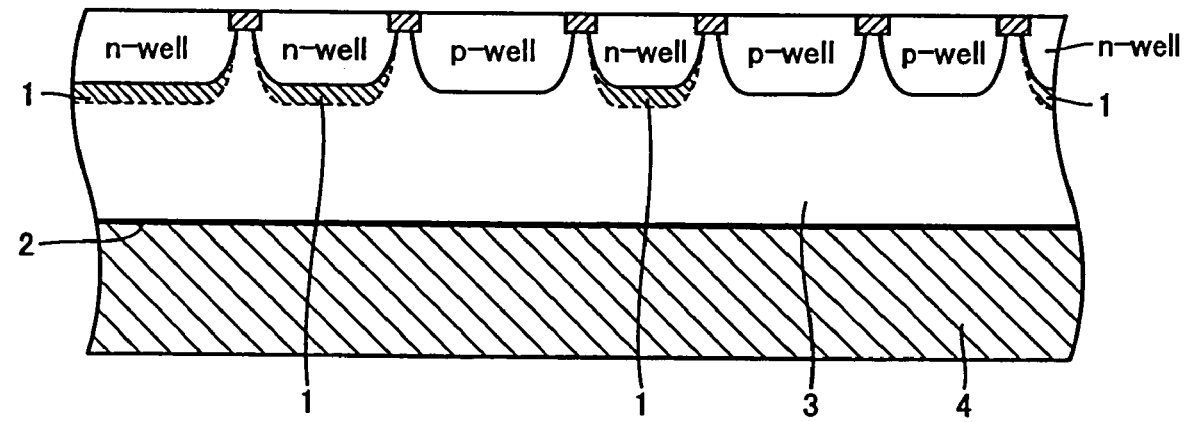

A silicon wafer of the present invention is a p type one with a resistivity of 100 Ωcm or more, in the vicinity of the surface being formed denuded zone, wherein when various heat treatments in the device fabrication process is performed, a p/n type conversion layer due to thermal donor generation is located at a depth apart from device active region and depletion layer region formed in contact therewith.

In the wafer, no p/n type conversion layer due to thermal donors is generated within a depth range of 8 μm from the surface. It is possible to generate a p/n type conversion layer at a depth apart from device active region and depletion layer region formed in contact therewith.

The resistivity is claimed to be 100 Ωcm or more, for the reason that with the increase in frequency used in devices, particularly getting above 1 GHz, there markedly occur noise and/or signal attenuation in conventional low resistivity substrates with a resistivity of 10 Ωcm or less, while the influence of the occurrence can be reduced in high resistivity ones. Additionally in low resistivity p type wafers with a resistivity less than 100 Ωcm, there exists a sufficient amount of dopant, whereby conversion of the conduction type from p type to n type cannot occur easily.

When a conversion of the conduction type from p type to n type due to thermal donors by a heat treatment in the device fabrication process using wafers occurs, the p/n type conversion layer is located at a depth apart from the device active region and depletion layer region formed in contact therewith, for the reason that the p/n type conversion layer, if brought into contact with these regions, has impacts on devices formed in the surface region, resulting in a faulty characteristics and/or an insufficient n-well separation.

The p/n type conversion layer is required not to be generated at a depth of 8 μm or less from the surface, for the reason that the p/n type conversion layer, if generated at a depth of 8 μm or less, has impacts on devices formed in the surface region. That is, the positioning of p/n type conversion layer at a depth of more than 8 μm means that even if a conversion of the conduction type from p type to n type by a heat treatment in the device fabrication process may occur, the layer converted to n type is internally located at a depth of more than 8 μm.

The heat treatment in the device fabrication process can be represented by a condition of, for example, 1 hour heating at 450 degrees C., where thermal donors are most likely to be generated. The position of the p/n type conversion layer can also be detected as a depth where the resistivity gets to locally maximum in the resistivity distribution in the wafer thickness direction by the measuring method for spread resistance.

The oxygen concentration in the wafer is not particularly limited as long as being included within the range of that contained in single crystals of silicon obtained by the normal CZ method. It is however preferable that oxygen in the wafer exists as oxygen precipitates that form BMD having gettering effect and that a heat treatment for forming such oxygen precipitates is performed.

Carbon, which has effects such as promoting the formation of electrically neutral oxygen precipitates having gettering effect and keeping the wafer strength when the interstitial oxygen (soluble oxygen) concentration is reduced due to the heat treatment resulting in an reduction in wafer strength, may be contained within the range of $0.5 \times 10^{16}$ to $32 \times 10^{16}$ atoms/cm$^3$ (ASTM F123-1981). Here, in the case of a content of less than $0.5 \times 10^{16}$ atoms/cm$^3$, the effects cannot be exerted sufficiently, while in the case of too large content, poly-crystallization can easily occur when growing single crystals by the CZ method. It is therefore preferable to contain $32 \times 10^{16}$ atoms/cm$^3$ or less of carbon. The foregoing silicon wafer is fabricated by applying a heat treatment to a wafer cut from a p type single crystal of silicon with a resistivity of 100 Ωcm or more and an oxygen concentration of about $10 \times 10^{17}$ to $20 \times 10^{17}$ atoms/cm$^3$ (ASTM F121-1979) grown by the CZ method. It is necessary to apply an oxygen outward diffusion heat treatment to the wafer at 1100 to 1200 degrees C. for 1 to 5 hours in a controlled atmosphere to prevent the generation of a p/n type conversion layer due to thermal donor generation at a depth range of 8 μm from the surface in the wafer when the heat treatment in the device fabrication process is performed.

The heat treatment above is performed to reduce the oxygen concentration in the surface layer by a sufficient outward diffusion of oxygen, whereby even if thermal donors are generated in the subsequent device fabrication process resulting in an internal conversion to a n type semiconductor, the p/n type conversion layer is located at a sufficient depth from the surface.

A controlled atmosphere using argon, hydrogen, a mixed gas thereof, or another mixed gas of nitrogen with a small amount of oxygen is used as the treatment atmosphere. The use of these gases allows outward diffusion of oxygen in a high-temperature heating to be promoted, whereby the p/n type conversion layer above can be located at a sufficient depth from the surface. First, in the case of argon, hydrogen, or a mixed gas thereof, there is an expected effect of oxygen outward diffusion as well as an effect of causing COP defects in the wafer surface layer to disappear, which makes it possible to obtain a wafer with a superior surface quality.

Although nitrogen is less expensive compared to argon and hydrogen, having advantages in cost, a treatment in nitrogen atmosphere, which also allows outward diffusion of oxygen, forms a nitride film on the wafer surface, which requires an additional process for removing the nitride film. It is consequently preferable to use a mixed gas of nitrogen with about 3% of oxygen as the controlled atmosphere. It should however be noted that in an atmosphere using nitrogen there is no effect of causing COP defects in the wafer surface layer to disappear.

The heat treatment is performed at a heating temperature of 1100 to 1250 degrees C. and for a heating time of 1 to 5 hours, for the reason that in the case of a temperature of less than 1100 degrees C., outward diffusion of oxygen itself is unlikely to occur, resulting in a small effect, while in the case of a temperature of more than 1250 degrees C., slip dislocation can easily be generated in the wafer and the burden put on the heat-treating furnace is increased, resulting in shortening of the life of internal structural parts in the furnace. Also, in the case of a heating time of less than 1 hour, the p/n type conversion layer cannot be located at a depth of more than 8 μm from the surface, while in the case of a heating time of more than 5 hours, the effect of oxygen outward diffusion is to be saturated.

It is preferable in the wafer of the present invention that after locating the p/n type conversion layer at a depth of more than 8 μm from the surface, BMD due to oxygen precipitates having gettering effect are formed sufficiently in the wafer, and further an oxygen precipitate heat treatment is performed to reduce the residual amount of oxygen in the wafer and thereby increase the resistivity.

The oxygen precipitate heat treatment above performs, after the foregoing oxygen outward diffusion heat treatment, a heat treatment for forming oxygen precipitate nuclei at 600 to 800 degrees C. for 1 to 20 hours for forming nuclei for oxygen precipitation and subsequently a heat treatment for growing oxygen precipitates at 1000 to 1100 degrees C. for 1 to 20 hours for forming BMD.

Since the heat treatments above are dependent on heating temperature and time, while independent of the atmosphere condition to be used, either of argon, hydrogen, a mixed gas thereof, or nitrogen, etc., can be used. Due to advantages in cost, as described above, it is preferable to use a mixed gas of nitrogen with about 3% of oxygen as an atmosphere.

The heat treatment for forming oxygen precipitate nuclei is performed at a heating temperature of 600 to 800 degrees C., for the reason that if out of this range, the formation of oxygen precipitate nuclei itself is unlikely to occur, resulting in a restriction of the effect. Also, the heat treatment is performed at a heating time of 1 to 20 hours, for the reason that in the case of a heating time of less than 1 hour, the effect cannot be exerted sufficiently, while in the case of a heating time of more than 20 hours, a further lengthening of time cannot cause any significant improvement of the effect and adds up to nothing.

After the heat treatment for forming oxygen precipitate nuclei, the heat treatment for growing oxygen precipitates is performed at 1000 to 1100 degrees C. for 1 to 20 hours. The heat treatment for growing oxygen precipitates is performed at a heating temperature of 1000 to 1100 degrees C., for the reason that in the case of a heating temperature of less than 1000 degrees C., the growing of oxygen precipitates is not promoted, while in the case of a heating temperature of more than 1100 degrees C., the growing of oxygen precipitates is not progressed, and further the amount of formed precipitate may be reduced due to re-solution. Also, the heat treatment is performed at a heating time of 1 to 20 hours, for the reason that in the case of a heating time of less than 1 hour, the growing of oxygen precipitates is not enough, while in the case of a heating time of more than 20 hours, a further lengthening of time causes the effect to be saturated.

As described above, in the fabrication method of the present invention, a p/n type conversion layer due to thermal donors, even if generated, is to be located at a depth to be brought into contact with neither any device active region nor depletion layer region to prevent faulty operation and/or n-well separation failure of CMOS.

Therefore, after the oxygen outward diffusion heat treatment, the heat treatment for forming oxygen precipitate nuclei and the heat treatment for growing oxygen precipitates are performed if necessary. As the conditions for these treatments, there are shown examples, that is, 1100 to 1250 degree C. temperature and 1 to 5 hour time for the oxygen outward diffusion heat treatment, 600 to 800 degree C. temperature and 1 to 20 hour time for the heat treatment for forming oxygen precipitate nuclei, and 1000 to 1100 degree C. temperature and 1 to 20 hour time for the heat treatment for growing oxygen precipitates.

However, specified conditions for each of the treatments are determined based on the wafer resistivity, the depth of high resistivity layer, the oxygen concentration, etc., required in accordance with the fabrication conditions for devices. Therefore, to generate a p/n type conversion layer at a depth to be brought into contact with neither any device active region nor depletion layer region, the initial oxygen concentration is determined according to the following procedure, and on the basis of this determination, specified heat treatments conditions are determined.

Figure 3:
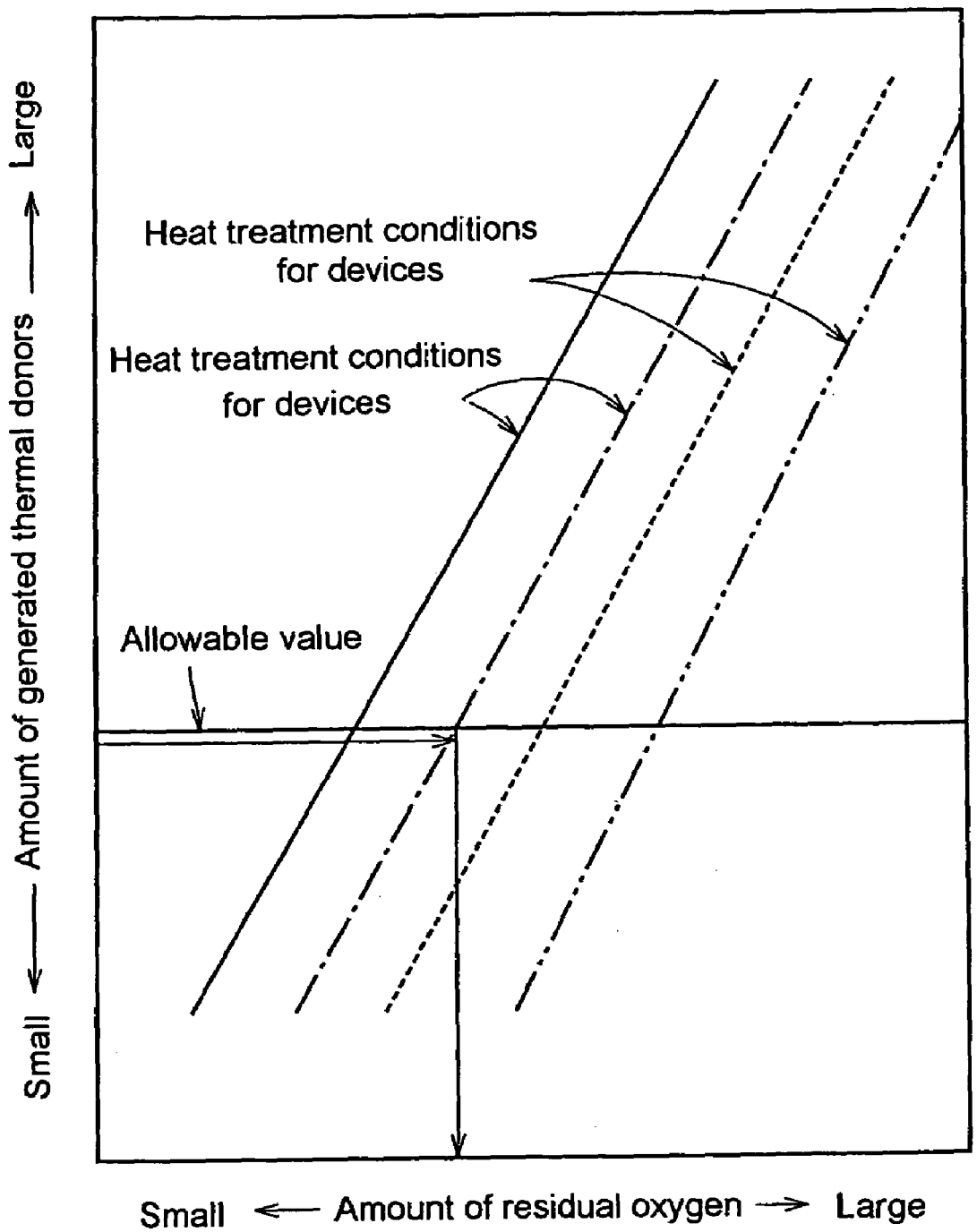
FIG. 3 is a view schematically showing the relationship between the amount of residual oxygen in a wafer and the density of thermal donors to be generated, using heat treatment conditions in the device fabrication process as parameters.

FIG. 3 is a view schematically showing the relationship between the amount of residual oxygen in a wafer and the density of thermal donors to be generated, using heat treatment conditions in the device fabrication process as parameters. First, the relationship between the residual amount of oxygen in a wafer and the generation amount of thermal donors for each heat treatment in the device fabrication process is prepared as a master table as shown in FIG. 3, where as a heat treatment condition in the device fabrication process, a heating temperature in the range of 400 to 500 degrees C. and a heating time in the range of 1 to 12 hours are used for example.

Next, based on the heat treatment condition (heat treatment sequence) in the device fabrication process, the density of thermal donors to be generated for each residual amount of oxygen is calculated from the master table. Meanwhile, the allowable generation amount of thermal donors is calculated from the wafer resistance and the depth of high resistivity layer that are defined by the specification for fabrication of devices.

The amount of residual oxygen at a target depth in wafer is determined by the allowable amount of thermal donors obtained. To secure the residual oxygen concentration determined, the initial oxygen concentration in a wafer made of a p type single crystal is determined, and on the basis of this determination, specified heat treatment conditions for oxygen outward diffusion heat treatment and other treatments if necessary using an oxygen precipitate heat treatment simulator are determined.

Further, in the fabrication method of the present invention, the p/n type conversion layer is generated at a depth to be brought into contact with neither any device active region nor depletion layer region, and after the oxygen outward diffusion heat treatment, the heat treatment for forming oxygen precipitate nuclei and the heat treatment for growing oxygen precipitates are performed if necessary, whereby the internal oxygen precipitation is further secured, resulting in a reduction in the generation amount of thermal donors.

Therefore, in the high resistivity silicon wafer of the present invention, there can occur not only a mode where in the case of a p type wafer, the conduction type is converted from p type to n type in the p/n type conversion layer, but also a mode where the conduction type is converted to p type again by promoting the internal oxygen precipitation.

EXAMPLES

A p type wafer with an oxygen concentration of $13 \times 10^{17}$ atoms/cm$^3$ (ASTM F121-1979) and a carbon concentration of $2.5 \times 10^{16}$ atoms/cm$^3$ (ASTM F123-1981) and with a resistivity of 500 Ωcm, which is made by the CZ method, was prepared to make the following three kinds of wafers:

A: to which no particular oxygen outward diffusion heat treatment has been applied;

B: to which a heat treatment has been applied at 1200 degrees C. for 1 hour in hydrogen-gas atmosphere; and C: to which, after a 1 hour heat treatment at 1200 degrees C. in hydrogen-gas atmosphere, a further heat treatment has been applied at 700 degrees C. for 4 hours in nitrogen-gas with 3% of oxygen atmosphere, and subsequently at 1000 degrees C. for 16 hours.

Figure 4:
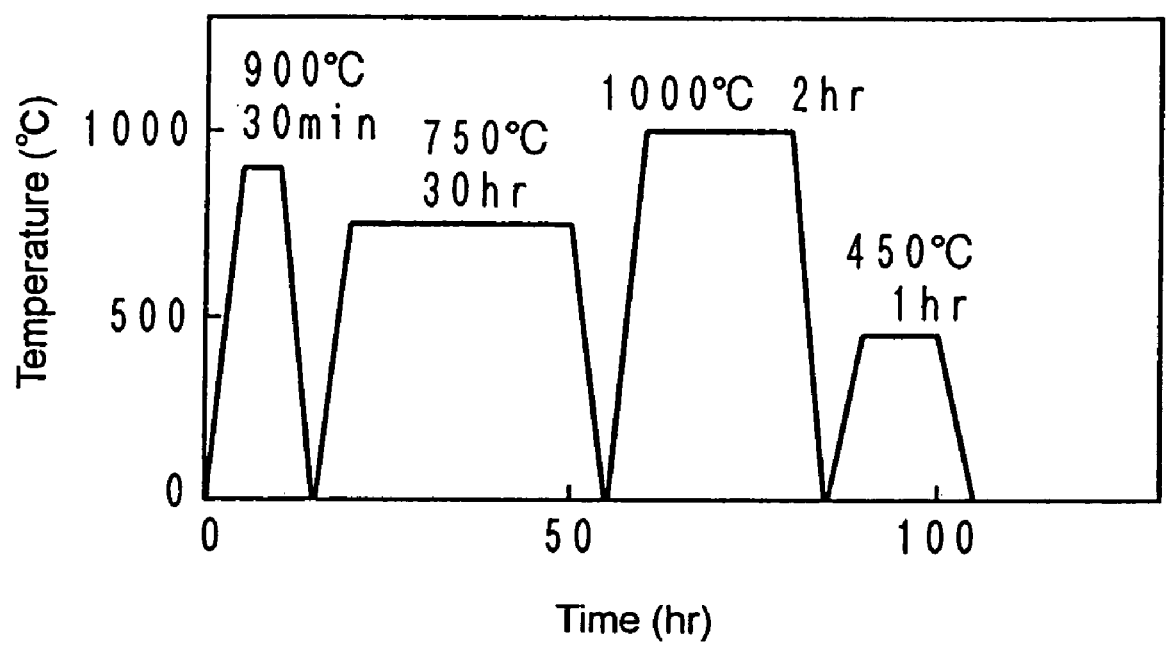
FIG. 4 is a view showing a heat treatment condition under which a process for forming CMOS on a wafer was simulated, which was used to examine the influence of thermal donor generation.

After applying a heat treatment corresponding to a thermal history in the CMOS fabrication process shown in FIG. 4 to each of the wafers above, the resistivity distribution in the thickness direction was obtained by the measuring method for spread resistance.

Figure 5:
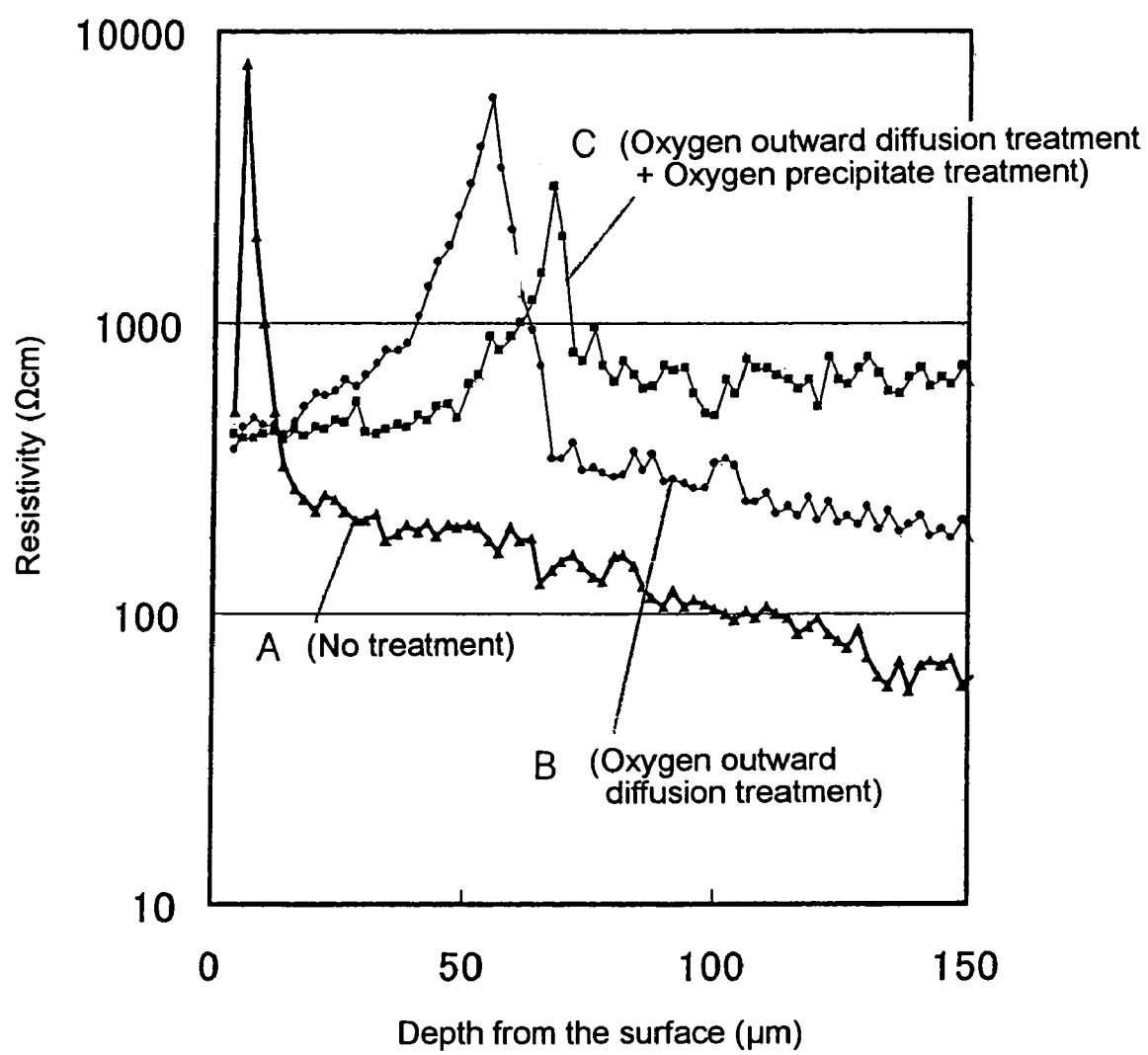
FIG. 5 is a view showing the measurement results of the resistivity distribution in the wafer thickness direction according to an embodiment.

FIG. 5 is a view showing the measurement results for the present embodiment. In FIG. 5, at the depth where the resistivity of each wafer gets to locally maximum is generated a p/n type conversion layer, on the surface side with the conversion layer as boundary being formed a p type semiconductor, while on the inner side an n type one. As is clear from the measurement results shown in FIG. 5, in the wafer A to which no oxygen outward diffusion heat treatment has been applied, a p/n type conversion layer appears at a depth of about 6 μm from the surface, while in the wafer B to which the oxygen outward diffusion heat treatment has been applied, a p/n type conversion layer appears at a depth of about 55 μm from the surface. In the wafer in which the p/n type conversion layer is located at 6 μm depth, there is a high risk for faulty operation of CMOS formed in the surface region, while the p/n type conversion layer located at 55 μm depth has little impact on the operation.

It is also found that in the wafer C. to which, after an oxygen outward diffusion heat treatment, an oxygen precipitate treatment for forming BMD has been further applied, the p/n type conversion layer is located at a deeper position, and the oxygen precipitation has been conducted sufficiently to reduce the amount of oxygen donors, resulting in an increase in resistivity of the inner portion converted to n type.

As described heretofore, the high resistivity silicon wafer of the present invention can cause the influence of thermal donors to disappear without reducing the soluble oxygen concentration in the wafer, whereby even if various heat treatments are performed in the device fabrication process, devices such as CMOS that offer superior characteristics can be fabricated.

What is claimed is:

1. A high resistivity p type silicon wafer with a resistivity of 100 Ωcm or more, in which a denuded zone is formed in the vicinity of a surface, wherein when a heat treatment in a device fabrication process is performed, a p/n type conversion layer due to thermal donor generation is located at a depth to be brought into contact with neither any device active region nor depletion layer region formed in contact therewith.

2. The high resistivity silicon wafer according to claim 1, which is internally composed of layers containing oxygen precipitates.

3. The high resistivity silicon wafer according to claim 1, which contains $0.5 \times 10^{16}$ to $32 \times 10^{16}$ atoms/cm$^3$ (ASTM F123-1981) of carbon.

4. A high resistivity p type silicon wafer with a resistivity of 100 Ωcm or more, in which a denuded zone is formed in the vicinity of a surface, wherein when a heat treatment in a device fabrication process is performed, a p/n type conversion layer due to thermal donor generation is located at a depth more than 8 μm from the surface.

5. The high resistivity silicon wafer according to claim 4, which is internally composed of layers containing oxygen precipitates.

6. The high resistivity silicon wafer according to claim 4, which contains $0.5 \times 10^{16}$ to $32 \times 10^{16}$ atoms/cm$^3$ (ASTM F123-1981) of carbon.

7. A method for fabricating a high resistivity silicon wafer, wherein a wafer with a resistivity of 100 Ωcm or more made of a p type single crystal obtained by the Czochralski method is used and an oxygen outward diffusion heat treatment is applied thereto, whereby when a heat treatment in a device fabrication process is performed, a p/n type conversion layer due to thermal donor generation is generated at a depth to be brought into contact with neither any device active region nor depletion layer region formed in contact therewith.

8. The method for fabricating a high resistivity silicon wafer according to claim 7, wherein said oxygen outward diffusion heat treatment is performed at 1100 to 1250 degrees C. for 1 to 5 hours in a controlled atmosphere.

9. The method for fabricating a high resistivity silicon wafer according to claim 7, wherein a heat treatment for forming oxygen precipitate nuclei and a heat treatment for growing oxygen precipitates are further performed after said oxygen outward diffusion heat treatment.

10. The method for fabricating a high resistivity silicon wafer according to claim 9, wherein said oxygen outward diffusion heat treatment is performed at 1100 to 1250 degrees C. for 1 to 5 hours in a controlled atmosphere.

11. The method for fabricating a high resistivity silicon wafer according to claim 9, wherein a heat treatment at 600 to 800 degrees C. for 1 to 20 hours and a heat treatment at 1000 to 1100 degrees C. for 1 to 20 hours are further performed after said oxygen outward diffusion heat treatment.

12. The method for fabricating a high resistivity silicon wafer according to claim 7, which contains $0.5 \times 10^{16}$ to $32 \times 10^{16}$ atoms/cm$^3$ (ASTM F123-1981) of carbon.

13. A method for fabricating a high resistivity silicon wafer, wherein a wafer with a resistivity of 100 μcm or more made of a p type single crystal obtained by the Czochralski method is used and an oxygen outward diffusion heat treatment is applied thereto, whereby when a heat treatment in a device fabrication process is performed, a p/n type conversion layer due to thermal donor generation is generated at a depth more than 8 μm from the surface.

14. The method for fabricating a high resistivity silicon wafer according to claim 13, wherein said oxygen outward diffusion heat treatment is performed at 1100 to 1250 degrees C. for 1 to 5 hours in a regulated atmosphere.

15. The method for fabricating a high resistivity silicon wafer according to claim 13, wherein a heat treatment for forming oxygen precipitate nuclei and a heat treatment for growing oxygen precipitates are further performed after said oxygen outward diffusion heat treatment.

16. The method for fabricating a high resistivity silicon wafer according to claim 15, wherein said oxygen outward diffusion heat treatment is performed at 1100 to 1250 degrees C. for 1 to 5 hours in a controlled atmosphere.

17. The method for fabricating a high resistivity silicon wafer according to claim 15, wherein a heat treatment at 600 to 800 degrees C. for 1 to 20 hours and a heat treatment at 1000 to 1100 degrees C. for 1 to 20 hours are further performed after said oxygen outward diffusion heat treatment.

18. The method for fabricating a high resistivity silicon wafer according to claim 13, which contains $0.5 \times 10^{16}$ to $32 \times 10^{16}$ atoms/cm$^3$ (ASTM F123-1981) of carbon.

* * * * *

UNITED STATES PATENT AND TRADEMARK OFFICE
CERTIFICATE OF CORRECTION

PATENT NO. : 7,226,571 B2
APPLICATION NO. : 10/964728
DATED : June 5, 2007
INVENTOR(S) : Takase et al.

It is certified that error appears in the above-identified patent and that said Letters Patent is hereby corrected as shown below:

On Title Page Item [56] under References Cited; Foreign Patent Documents, the following insert should be included:

JP 2002-100631 4/2002

Signed and Sealed this

Twenty-ninth Day of July, 2008

JON W. DUDAS
*Director of the United States Patent and Trademark Office*